(12) United States Patent
Chen et al.

(10) Patent No.: US 9,111,796 B2
(45) Date of Patent: Aug. 18, 2015

(54) SEMICONDUCTOR STRUCTURE AND LAYOUT STRUCTURE FOR MEMORY DEVICES

(71) Applicant: UNITED MICROELECTRONICS CORP., Hsin-Chu (TW)

(72) Inventors: Zhen Chen, Singapore (SG); Shen-De Wang, Hsinchu County (TW); Yi-Shan Chiu, Taoyuan County (TW); Wei Cheng, Singapore (SG)

(73) Assignee: UNITED MICROELECTRONICS CORP., Science Based Industrial Park, Hsin-Chu (TW)

( * ) Notice: Subject to any disclaimer, the term of this patent is extended or adjusted under 35 U.S.C. 154(b) by 39 days.

(21) Appl. No.: 14/158,875

(22) Filed: Jan. 20, 2014

(65) Prior Publication Data
US 2015/0206894 A1    Jul. 23, 2015

(51) Int. Cl.
| H01L 27/115 | (2006.01) |
| H01L 23/00 | (2006.01) |
| H01L 27/02 | (2006.01) |
| H01L 27/105 | (2006.01) |

(52) U.S. Cl.
CPC .............. *H01L 27/115* (2013.01); *H01L 24/09* (2013.01); *H01L 27/0207* (2013.01); *H01L 27/1052* (2013.01); *H01L 27/11524* (2013.01)

(58) Field of Classification Search
None
See application file for complete search history.

(56) References Cited

U.S. PATENT DOCUMENTS

| 7,248,500 | B2 * | 7/2007 | Tamada et al. | 365/185.2 |
| 8,354,697 | B2 * | 1/2013 | Shimizu et al. | 257/206 |
| 8,362,535 | B2 * | 1/2013 | Shih et al. | 257/296 |
| 8,546,867 | B2 * | 10/2013 | Chakihara et al. | 257/316 |
| 8,575,703 | B2 * | 11/2013 | Ishizu | 257/368 |
| 8,618,579 | B2 * | 12/2013 | Shimizu et al. | 257/206 |
| 2002/0131291 | A1 * | 9/2002 | Kurjanowicz et al. | 365/69 |
| 2004/0156255 | A1 * | 8/2004 | Tsukikawa | 365/206 |
| 2006/0028868 | A1 * | 2/2006 | Okazaki et al. | 365/185.05 |
| 2014/0048889 | A1 * | 2/2014 | Bitterlich | 257/369 |
| 2015/0072531 | A1 * | 3/2015 | Tung | 438/703 |

FOREIGN PATENT DOCUMENTS

JP     2011171755     9/2011

* cited by examiner

*Primary Examiner* — Andres Munoz
(74) *Attorney, Agent, or Firm* — Winston Hsu; Scott Margo

(57) ABSTRACT

A layout structure for memory devices includes a plurality of first gate patterns, a plurality of first landing pad patterns, a plurality of dummy patterns, a plurality of second landing pad patterns, and a plurality of second gate patterns. The first landing pad patterns are parallel with each other and electrically connected to the first gate patterns. The dummy patterns and the first landing pad patterns are alternately arranged, and the second landing pad patterns are respectively positioned in between one first landing pad pattern and one dummy pattern. The second gate patterns are electrically connected to the second landing pad patterns.

18 Claims, 2 Drawing Sheets

SEMICONDUCTOR STRUCTURE AND LAYOUT STRUCTURE FOR MEMORY DEVICES

BACKGROUND OF THE INVENTION

1. Field of the Invention

The invention relates to a semiconductor structure and a layout structure for memory devices, and more particularly, to a semiconductor structure and a layout structure for flash memory devices.

2. Description of the Prior Art

Semiconductor memory has become increasingly popular for used in various electronic devices. For example, non-volatile semiconductor memory is used in cellular telephones, digital cameras, personal digital assistants, mobile computing devices. Electrically erasable programmable read only memory (EEPROM) and flash memory are among the most popular non-volatile semiconductor memories.

With rapid advancement of semiconductor fabricating technology and miniaturization of the devices, more and more challenges have been emerged. For example, a conventional flash memory cell includes a memory gate and a select gate adjacent to the memory gate. With the shrink of the device size and of the process window, device performance becomes more and more susceptible to the misalignment between the select gate and the contact plugs. The memory devices are even failed because of the misalignment issue. Furthermore, when a spacer-typed select gate approach is adopted, the select gate includes a sloped profile and thus the contact plug, which must be infallibly landed on the spacer-typed select gate, may not physically contacts the select gate and thus adversely impacts the reliability.

SUMMARY OF THE INVENTION

According to an aspect of the present invention, a layout structure for memory devices is provided. The layout structure includes a plurality of first gate patterns, a plurality of first landing pad patterns, a plurality of dummy patterns, a plurality of second landing pad patterns, and a plurality of second gate patterns. The first landing pad patterns are parallel with each other and electrically connected to the first gate patterns. The dummy patterns and the first landing pad patterns are alternately arranged. The second landing pad patterns are respectively disposed in between one first landing pad pattern and one dummy pattern. The second gate patterns are electrically connected to the second landing pad patterns.

According to another aspect of the present invention, a semiconductor structure for memory devices is provided. The semiconductor structure includes a substrate, a plurality of memory devices disposed on the substrate, a plurality of memory gate landing pads disposed on the substrate, a plurality of dummy gates disposed on the substrate, a plurality of select gate landing pads disposed on the substrate, and a plurality of select gate contact plugs disposed on the select gate landing pads. The memory devices respectively include a memory gate and a select gate. The memory gate landing pads are electrically connected to the memory gates and the select gate landing pads are electrically connected to the select gates. The dummy gates and the memory gate landing pads are alternately arranged. The select gate landing pads are respectively disposed between one memory gate landing pad and one dummy gate. The select gate landing pads respectively include a recess and a bottom of the recess includes a flat surface. More important, the select gate contact plugs are in contact with the flat surfaces of the select gate landing pads, respectively.

According to the semiconductor structure and layout structure for the memory devices provided by the present invention, the process window of the select gate landing pads is improved by adding the dummy gates. Also, the select gate landing pads obtain the recess having the flat surface due to the dummy gates. Consequently, the select gate contact plugs are infallibly landed on and in contact with the flat surfaces of the select gate landing pads, and thus the reliability of the memory devices is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
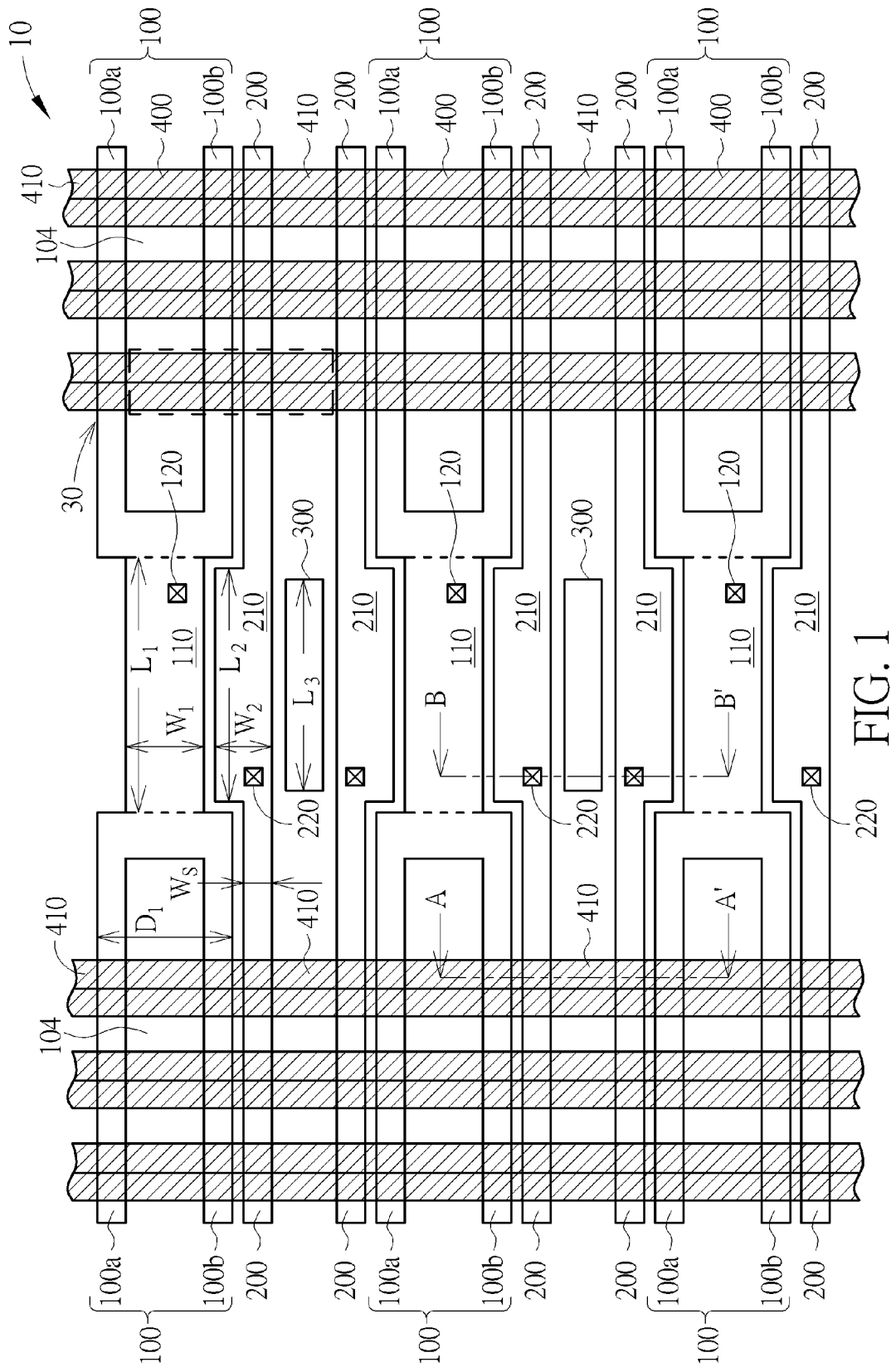
FIG. 1 is a schematic drawing illustrating a layout structure for memory devices provided by a preferred embodiment of the present invention.
Figure 2:
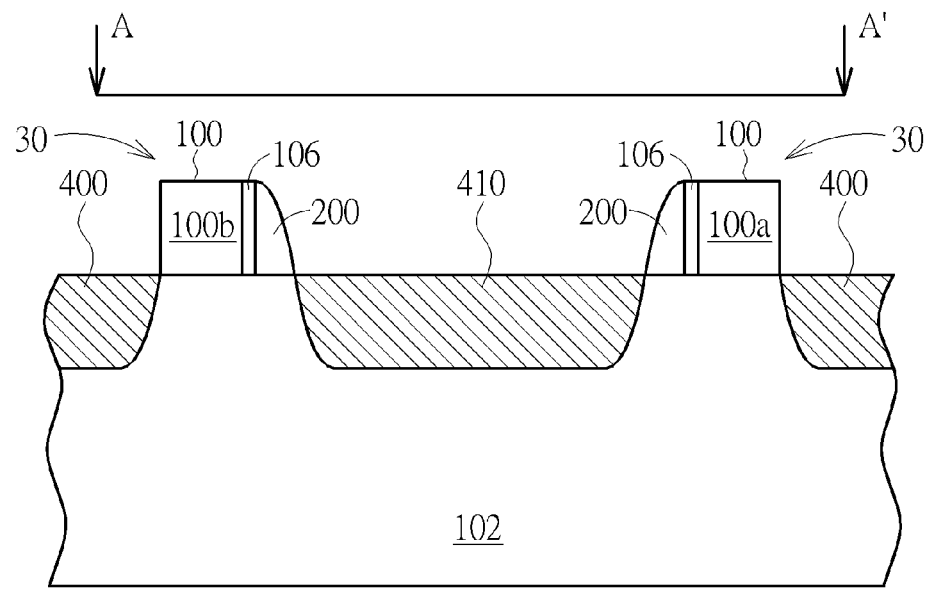
FIG. 2 is a cross-sectional view of a semiconductor structure for memory devices taken along a line A-A' of FIG. 1.
Figure 3:
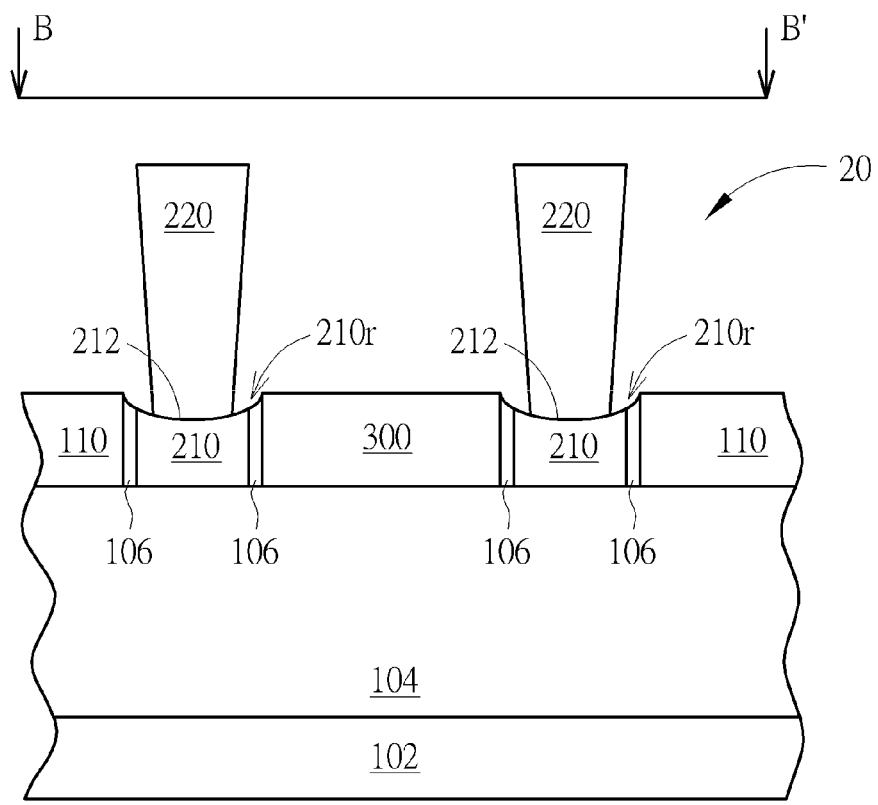
FIG. 3 is a cross-sectional view of a semiconductor structure for memory devices taken along a line B-B' of FIG. 1.

Please refer to FIGS. 1-3, wherein FIG. 1 is a schematic drawing illustrating a layout structure for memory devices provided by a preferred embodiment of the present invention, FIG. 2 is a cross-sectional view of a semiconductor structure for memory devices taken along a line A-A' of FIG. 1, and FIG. 3 is a cross-sectional view of a semiconductor structure for memory devices taken along a line B-B' of FIG. 1. Please refer to FIG. 1. According to the preferred embodiment, a layout structure 10 for memory devices includes a plurality of first gate patterns 100a and 100b. The first gate patterns 100a and 100b serve as memory gates of memory devices. More important, the first gate patterns 100a and 100b are grouped into pairs as shown in FIG. 1 according to the preferred embodiment. In other words, one first gate pattern 100a and one first gate pattern 100b, which are parallel with each other, are grouped into a first gate pattern pair 100. The first gate patterns 100a and 100b of each first gate pattern pair 100 include a distance $D_1$ therebetween. The layout structure 10 for the memory devices further includes a plurality of first landing pad patterns 110, and the first landing pad patterns 110 serve as memory gate landing pads for the memory devices. The first landing pad patterns 110 are parallel with each other and electrically connected to the first gate patterns 100a and 100b. In detail, the first gate patterns 100a and 100b of each first gate pattern pair 100 are physically and electrically connected to one first landing pad pattern 110. Furthermore, the first landing pad patterns 110 include a width $W_1$, and the width $W_1$ is smaller than the distance $D_1$ between the first gate patterns 100a and 100b grouped into the first gate pattern pair 100.

Please refer to FIG. 1 again. The layout structure 10 for the memory devices provided by the preferred embodiment further includes a plurality of second gate patterns 200, a plurality of second landing pad patterns 210, and a plurality of dummy patterns 300. The second gate patterns 200 serves as select gates for the memory devices, the second landing pad patterns serve as the select gate landing pads for the memory devices, and the second gate patterns 200 are physically and electrically connected to the second landing pad patterns 210. The second gate patterns 200 include a width $W_S$, the second landing pad patterns 210 include a width $W_2$, and the width $W_2$ of the second landing pad patterns 210 is larger than the width $W_S$ of the second gate patterns 200. Additionally, the first landing pad patterns 110 include a length $L_1$, the second landing pad patterns 210 include a length $L_2$, and the dummy patterns 300 include a length $L_3$. According to the preferred embodiment, the length $L_1$ of the first landing pad patterns 110 is larger than the length $L_2$ of the second landing pad patterns 210, and the length $L_2$ of the second landing pad patterns 210 is larger than the length $L_3$ of the dummy patterns 300.

Please still refer to FIG. 1. The second landing pad patterns 210 and the dummy patterns 300 are formed correspondingly to the first landing pad pattern 110, respectively. More important, the dummy patterns 300 and the first landing pad patterns 110 are alternately arranged and the second landing pad patterns 210 are respectively disposed in between one first landing pad pattern 110 and one dummy pattern 300. Furthermore, the dummy patterns 300 are electrically isolated from the first landing pad patterns 110, the first gate patterns 100a/100b, the second landing pad patterns 210, and the second gate patterns 200.

Please still refer to FIG. 1. The layout structure 10 for the memory devices provided by the preferred embodiment further includes a plurality of first doped patterns 400 and a plurality of second doped patterns 410. The first doped patterns 400 are formed within each first gate pattern pair 100. In other words, the first doped patterns 400 are formed in between the first gate pattern 100a and the first gate pattern 100b grouped into the pair. The second doped patterns 410 are formed in between the second gate patterns 200. According to the preferred embodiment, the first doped patterns 400 serve as source regions for the memory devices and the second doped patterns 410 serve as drain regions for the memory devices. The layout structure 10 for the memory devices provided by the preferred embodiment further includes a plurality of first contact plug patterns 120 formed on the first landing pad patterns 110 and a plurality of second contact plug patterns 220 formed on the second landing pad patterns 210. As shown in FIG. 1, the first contact plug patterns 120 are arranged as a straight line and the second contact plug patterns 220 also are arranged as a straight line. But a connecting line of the first contact plug patterns 120 and a connecting line of the second contact plug patterns 220 must not overlap.

According to the layout structure 10 for the memory devices provided by the preferred embodiment, the width $W_1$ of the first landing pad patterns 110 is smaller than the distance $D_1$ between the first gate pattern 100a and the first gate pattern 100b of each first gate pattern pair 100. Accordingly, a neck is formed in each first gate pattern pair 100 and thus a space for accommodating the dummy gates 300 and the second landing pad patterns 210 whose width $W_2$ is larger than the second gate patterns 200 is obtained. In other words, the width $W_2$ of the second landing pad patterns 210 is increased without modifying the distance $D_1$ between the first gate pattern 100a and the first gate pattern 100b and without modifying the width $W_S$ of the second gate patterns 200. Therefore alignment accuracy between the second contact plug patterns 220 and the second landing pad patterns 210 is improved.

Please refer to FIGS. 2-3. FIGS. 2-3 are cross-sectional views of a semiconductor structure for memory devices provided by the preferred embodiment of the present invention. As mentioned above, FIG. 2 is a cross-section view taken along a line A-A' of FIG. 1 and FIG. 3 is a cross-section view taken along a line B-B' of FIG. 1. In other words, a layout structure of the semiconductor structure for the memory devices provided by the preferred embodiment can be shown as FIG. 1. In order to clearly describe the structure of the present invention, FIGS. 1-3 should be referred together. As shown in FIGS. 2-3, the semiconductor structure 20 for the memory devices provided by the preferred embodiment includes a substrate 102, and a plurality of isolation structures 104 are formed in the substrate 102. The semiconductor structure 20 for the memory devices includes a plurality of memory devices 30 formed on the substrate 102. The memory devices 30 respectively include a memory gate 100a or 100b and a select gate 200. As shown in FIG. 2, the select gate 200 is adjacent to one memory gate 100a or 100b, and the adjacent select gate 200 and the memory gates 100a or 100b are electrically isolated from each other by an insulating layer 106. The memory devices 30 further include a source region 400 and a drain region 410. As shown in FIG. 2, the source region 400 is formed in the substrate 102 at a side of the memory gate 100a or 100b opposite to the select gate 200, and a drain region 410 is formed in the substrate 102 at a side of the select gate 200 opposite to the memory gate 100a or 100b.

Please refer to FIGS. 1 and 3. The semiconductor structure 20 for memory devices of the preferred embodiment further includes a plurality of memory gate landing pads 110, a plurality of select gate landing pads 210, and a plurality of dummy gates 300 positioned on the isolation structures 104 in the substrate 102. As shown in FIG. 1, the memory gates 100a/100b are grouped into pairs 100, and each memory gate pair 100 is electrically connected to the memory gate landing pads 110. The dummy gates 300 and the memory gate landing pads 110 are alternately arranged, and the select gate landing pads 210 are respectively disposed in between one memory gate landing pad 110 and one dummy gate 300. The select gate landing pads 210 are electrically connected to the select gates 200. The semiconductor structure 20 for memory devices of the preferred embodiment further includes a plurality of select gate contact plugs 220 and a plurality of memory gate contact plugs 120. The select gate contact plugs 220 are landed on and electrically connected to the select gate landing pads 210, respectively. Also, the memory gate contact plugs 120 are landed on and electrically connected to the memory gate landing pads 110, respectively.

Please refer to FIGS. 2 and 3. According to the preferred embodiment, the memory gate landing pads 110, the select gate landing pads 210, the dummy gates 300, the memory gates 100a/100b, and the select gates 200 can include the same material, for example but not limited to polysilicon. However, the memory gate landing pads 110, the memory gates 100a/100b, and the dummy gates 300 can include the same material and be formed simultaneously while the select gate landing pads 210 and the select gates 200 can include the same material which is different from that for forming the memory gate landing pads 110, the memory gates 100a/100b, and the dummy gates 300, and be formed after forming the memory gate landing pads 110, the memory gates 100a/100b and the dummy gates 300. The semiconductor structure 20 for memory devices further includes a plurality of insulating layers 106 for electrically isolating the memory gate landing pads 110, the select gate landing pads 210, and the dummy gates 300. More important, the select gates 200 of the semiconductor structure 20 for the memory devices of the preferred embodiment include spacer-typed select gates. As shown in FIG. 2, the spacer-typed select gates 200 include a sloped profile/surface. For forming the spacer-typed select gates 200, an etching back process is performed to each back two polysilicon layers formed at two opposite sides of the memory gate pairs 100. Consequently, the spacer-typed select gates 200 are formed at the two opposite sides of the memory gate pairs 100. More important, because the memory gate landing pads 110 and the dummy gates 300 are alternately arranged in accordance with the preferred embodiment, the etch back process is obstructed from the select gate landing pads 210, which are disposed between the memory gate landing pads 110 and the dummy gates 300. Consequently, the polysilicon layers between the memory gate landing pads 110 and the dummy gates 300 is not sufficiently etched back due to the dummy gates 300, and a recess 210r having a flat surface 212 is formed on top of each select gate landing pad 210. Briefly speaking, the etching back process is used to simultaneously form the spacer-typed select gates 200 and to form the select gate landing pads 210 between the memory gate landing pads 110 and the dummy gates 300. And spacer-typed select gates 200 spontaneously have the sloped surface while the select gate landing pads 210 spontaneously include the flat surfaces 212. Therefore, the following formed select gate contact plugs 220 can be infallibly landed on and in contact with the flat surfaces 212 of the select gate landing pads 210. Accordingly, electrical connection between the select gate contact plugs 220 and the select gate landing pads 210 is accomplished.

According to the semiconductor structure 20 for the memory devices provided by the preferred embodiment, the select gate landing pads 210 include the flat surface 212, therefore the select gate contact plugs 220 are landed on and in contact with the flat surfaces 212 instead of a sloped profile/surface as those spacer-typed select gates 200 included. Consequently, electrical connection between the select gate landing pads 210 and the select gate contact plugs 220 is accomplished and thus reliability of the memory devices 30 is improved.

According to the semiconductor structure and layout structure for the memory devices provided by the present invention, the width of the memory gate landing pads is reduced to be smaller than the distance between the two memory gates grouped into one memory gate pair, and thus space for increasing the width of the select gate landing pads and for accommodating the dummy gates is gained. As the width of the select gate landing pads is increased, the alignment accuracy between the select gate landing pads and the select gate contact plugs is improved, and thus process window for forming the memory devices is improved. On the other hand, by adding the dummy patterns, the select gate landing pads having the flat surface are spontaneously obtained during forming the spacer-typed select gates. Consequently, the select gate contact plugs are infallibly landed on and in contact with the flat surfaces of the select gate landing pads, and thus the electrical connection between the select gate contact plugs and the select gate landing pads is accomplished and reliability is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout structure for memory devices, comprising:
   a plurality of first gate patterns;
   a plurality of first landing pad patterns parallel with each other and electrically connected to the plurality of first gate patterns;
   a plurality of dummy patterns, the plurality of dummy patterns and the plurality of first landing pad patterns being alternately arranged;
   a plurality of second landing pad patterns respectively disposed in between one first landing pad pattern of the plurality of first landing pad patterns and one dummy pattern of the plurality of dummy patterns; and
   a plurality of second gate patterns electrically connected to the plurality of second landing pad patterns.

2. The layout structure for the memory devices according to claim 1, wherein the plurality of dummy patterns are electrically isolated from the plurality of first landing pad patterns, the plurality of first gate patterns, the plurality of second landing pad patterns, and the plurality of second gate patterns.

3. The layout structure for the memory devices according to claim 1, wherein the plurality of first gate patterns are grouped into a plurality of pairs.

4. The layout structure for the memory devices according to claim 3, wherein one first landing pad pattern of the plurality of first landing pad patterns is electrically connected to the plurality of first gate patterns grouped into one pair of the plurality of pairs.

5. The layout structure for the memory devices according to claim 4, wherein a width of the plurality of first landing pad patterns is smaller than a distance between the plurality of first gate patterns grouped into the one pair.

6. The layout structure for the memory devices according to claim 5, wherein the plurality of dummy patterns and the plurality of second landing pad patterns are formed correspondingly to the plurality of first landing pad patterns, respectively.

7. The layout structure for the memory devices according to claim 3, further comprising a plurality of first doped patterns formed in between the plurality of first gate patterns grouped into one pair of the plurality of pairs.

8. The layout structure for the memory devices according to claim 1, further comprising a plurality of second doped patterns formed between the plurality of second gate patterns, respectively.

9. The layout structure for the memory devices according to claim 1, wherein a width of the plurality of second landing pad patterns is larger than a width of the plurality of second gate patterns.

10. The layout structure for the memory device according to claim 1, wherein a length of the plurality of dummy patterns is smaller than a length of the plurality of first landing pad patterns and a length of the plurality of second landing pad patterns.

11. The layout structure for the memory devices according to claim 1, further comprising a plurality of first contact plug patterns respectively formed on the plurality of first landing pad patterns and a plurality of second contact plug patterns respectively formed on the plurality of second landing pad patterns.

12. A semiconductor structure for memory devices comprising:
   a substrate;
   a plurality of memory devices disposed on the substrate, the plurality of memory devices respectively comprising a memory gate and a select gate;
   a plurality of memory gate landing pads disposed on the substrate and electrically connected to the plurality of memory gates of the plurality of memory devices;
   a plurality of dummy gates disposed on the substrate, the plurality of dummy gates and the plurality of memory gate landing pads being alternately arranged;
   a plurality of select gate landing pads respectively disposed between one memory gate landing pad of the plurality of memory gate landing pads and one dummy gate of the plurality of dummy gates, and electrically connected to the plurality of select gates of the plurality of memory devices; and a plurality of select gate contact plugs respectively disposed on the plurality of select gate landing pads, wherein the plurality of select gate landing pads respectively comprise a recess, a bottom of the recess comprises a flat surface, and the plurality of select gate contact plugs are in contact with the flat surface, respectively.

13. The semiconductor structure for the memory devices according to claim 12, wherein the plurality of select gates of the plurality of memory devices are respectively adjacent to the plurality of memory gates of the plurality of memory devices, and an adjacent select gate of the plurality of select gates and memory gate of the plurality of memory gates are electrically isolated from each other.

14. The semiconductor structure for the memory devices according to claim 12, wherein the select gate comprises a spacer-type select gate, and respectively comprises a sloped surface.

15. The semiconductor structure for the memory devices according to claim 12, wherein the plurality of memory devices further respectively comprise a source region formed in the substrate at a side of the memory gate opposite to the select gate, and a drain region formed in the substrate at a side of the select gate opposite to the memory gate.

16. The semiconductor structure for the memory devices according to claim 12, wherein the plurality of memory gate landing pads, the plurality of select gate landing pads, the plurality of dummy gates, the plurality of memory gates of the plurality of memory devices, and the plurality of select gates of the plurality of memory devices comprise a same material.

17. The semiconductor structure for the memory devices according to claim 12, further comprising a plurality of insulating layers electrically isolating the plurality of memory gate landing pads, the plurality of select gate landing pads, and the plurality of dummy gates.

18. The semiconductor structure for the memory devices according to claim 12, further comprising a plurality of memory gate contact plugs electrically connected to the plurality of memory gate landing pads, respectively.

* * * * *